METHOD OF MAKING CONNECTIONS AND CONDUCTIVE PATHS

Filed Aug. 31, 1967

INVENTORS
RICHARD A. FEULNER
LEWIS F. MILLER
STEPHEN A. MILKOVICH

BY Maurice H. Klitzman
ATTORNEY

Feb. 9, 1971 R. A. FEULNER ET AL 3,561,110

METHOD OF MAKING CONNECTIONS AND CONDUCTIVE PATHS

Filed Aug. 31, 1967 2 Sheets-Sheet 2

United States Patent Office 3,561,110
Patented Feb. 9, 1971

3,561,110

METHOD OF MAKING CONNECTIONS AND CONDUCTIVE PATHS

Richard A. Feulner, Hopewell Junction, Stephen A. Milkovich, M D Beacon, and Lewis F. Miller, La Grangeville, N.Y., assignors to International Business Machines Corporation, Armonk, N.Y., a corporation of New York Filed Aug. 31, 1967, Ser. No. 664,809
Int. Cl. B41m 3/08
U.S. Cl. 29—602 3 Claims

ABSTRACT OF THE DISCLOSURE

Electrical and/or thermal connection between conductive layers in ceramic or other high temperature substrates, and internal or attached metallurgical structures, is obtained by filling via or transverse holes with dry metallic particles and sintering.

CROSS REFERENCES TO RELATED APPLICATIONS

Copending application of McIntosh entitled "Ceramic Compositions and Fired Ceramic Bodies," Ser. No. 626,788, filed Mar. 29, 1967, and assigned to the same assignee as the present invention (IBM Docket 14,496).

Copending application of Miller entitled "Conductive Element and Method," Ser. No. 370,467, filed May 27, 1964, Pat. No. 3,374,110 and assigned to the same assignee as the present invention (IBM Docket 14,099).

BACKGROUND OF THE INVENTION

(1) Field of invention

Our invention relates to processes for manufacture of of thermal, inductive, and/or electrical patterns and/or devices. More specifically, it relates to processes for obtaining interconnection of metallic devices arranged on various levels of a printed circuit module.

(2) Description of the prior art

The use of via holes in printed circuit modules for providing means for interconnecting the circuits on the various levels of the circuit module is well known in the art. Because of the extremely small size of said via holes, the basic problem is to devise a method for filling said holes with conductive materials which is both economical and reliable.

One method known to the prior art for filling via holes is to mechanically press into the hole a quantity of copper or like metal particles. This method requires the use of extremely accurate and expensive localized pressure equipment, for localizing the pressure directly over the surface of the hole to prevent damage to the ceramic. As a result, this technique is not practical except with relatively large diameter holes. Another problem resulting from the extreme accuracy required in localizing the pressure is the complexity and expense of equipment designed to handle various hole location patterns; otherwise, each individual circuit arrangement would have to have its own unique pressure equipment.

Another means for interconnecting metallic structures or circuits in a ceramic slip, that is, a single sheet of ceramic material, is to fill via holes with a paste comprising metallic particles held in a fluid binder. Where more than one level is required, a plurality of said ceramic slips are stacked on each other after filling the via holes with said paste, bonded such that the via holes are in desired relationship, and then heated for a time and temperature sufficient to volatilize the binder and sinter the metal particles. This method requires that the via holes be filled before the ceramic slips are bonded together in a stacked relationship. This can result in contamination on the surface of the slips, and also in registration problems of the holes. Also, it is usually required that the holes in each ceramic slip be filled with paste from both sides in order to assure that said holes are completely filled. If an attempt is made to fill deep, small diameter holes (that is, cavities) with this method voids often results, especially if the paste is thick. If a low viscosity or thin paste is used in an attempt to fill a deep, narrow hole, there is often insufficient metal in the hole after sintering to form a good conductive plug. Also, any of the binder or paste that is not volatilized, reduces the conductivity of the sintered metallic plug in the via hole. Another problem with this method is the difficulty in establishing good butt or edge contacts internally.

The prior art has not developed a practical method for connecting internal structures or providing a conductive path through very small tansverse holes in non-metallic bodies. Transverse holes are holes which are not normal to the surface of the substrate, such as those connecting via holes.

SUMMARY OF THE INVENTION

It is therefore an object of our invention, in providing thermal, magnetic, or electrical connection between conductive lands or other metallurgical structures in a high temperature substrate such as a ceramic circuit module, to avoid the use of high pressure on the ceramic to fill the holes, and avoid the need for pressure localizing equipment.

It is a further object of our invention to provide consistently good conductivity by eliminating the possibility of the presence of non-volatilized paste, voids, or filler material in the via holes.

It is a further object of our invention to provide a method for filling the via holes after the ceramic slips have been stacked, bonded, and in most instances fired.

It is a further object of our invention to provide a method for establishing butt or edge contacts internally, and for replacing interstitial pins.

It is a further object of our invention to minimize the exposure to contamination on the surfaces of the individual slip.

It is a further object of our invention to avoid registration problems between via holes in different slips to be bonded together, to minimize the number of individual holes which must be filled and/or repaired, and to minimize the cost and number of process steps required to provide a conductive path through transverse or via holes.

It is a further object of our invention to provide specific metallurgical systems and particle ranges for best performance.

It is a further object of our invention to provide an improved method of filling very small holes with closed bottoms.

It is a further object of our invention to provide an improved method for making transverse or U-shaped sections within high temperature, typically ceramic substrates.

In general, therefore, our invention provides a highly reliable and economic method for providing electrical or thermal connection through vertical via holes or transverse holes or paths in high temperature substrates, such as, ceramic printed circuit modules, selectively connecting internal lands, external lands, and other internal or attached metallurgical structures. A ceramic module is a stack of one or more ceramic slips having printed circuits or other metallic structures such as conductors, resistors, capacitors, inductors, etc. printed on or attached to said slip prior to or after being stacked.

Via holes and/or transverse holes in the substrates are filled with metallic particles, ranging from approximately .5 to 3 mils in diameter, and then sintered. The metallic element or alloy chosen for filling the holes is selected so as to be metallurgically compatible with the ceramic and the internal or external lands, or other metallurgical structures to which the via hole or transverse hole is to make contact, in the same substrate or printed circuit module assembly. The relationship that must be maintained between the size of the metallic particles and the diameter of the via or transverse holes is a critical element of our invention.

The conductive plug formed in the hole may be further strengthened, solidified and made more conductive by applying molten metal, such as solder, to the surface of the hole, and allowing it to permeate through the spaces between the sintered particles.

BRIEF DESCRIPTION OF THE DRAWING

The foregoing and other objects, features, and advantages of the invention will be apparent from the following more particular description of preferred embodiments of the invention, as illustrated in the accompanying drawings.

DESCRIPTION OF THE PREFERRED EMBODIMENT

Figure 1:
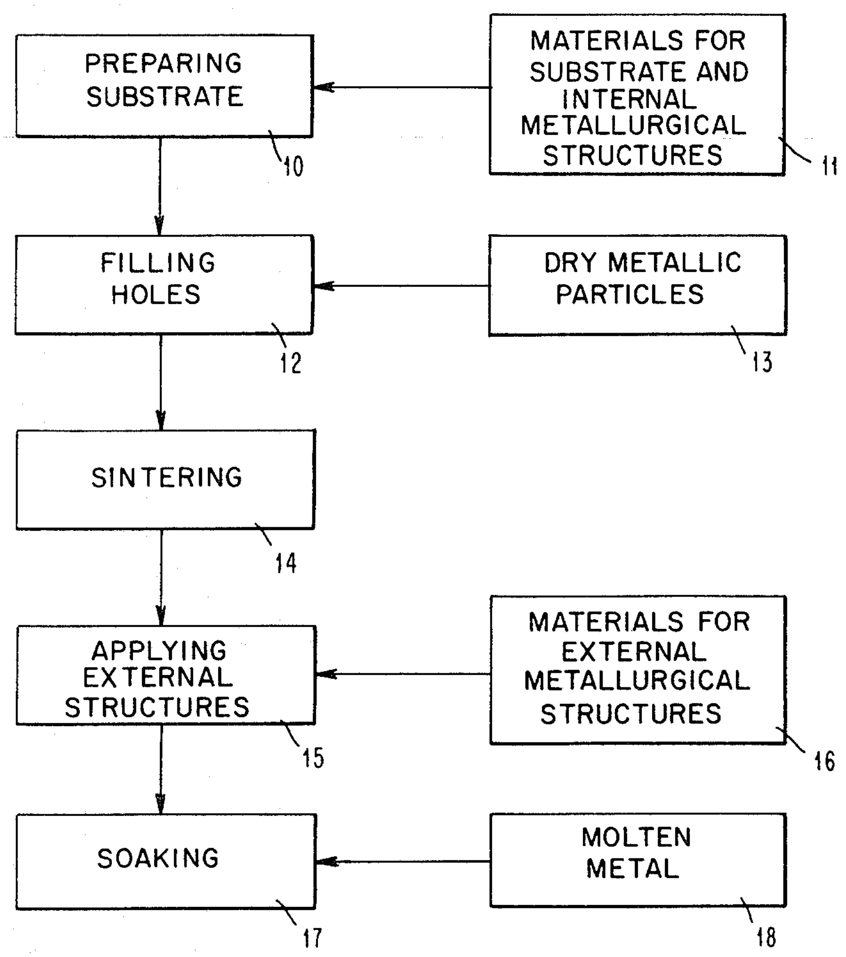
FIG. 1 is a process flow diagram containing the steps of our basic invention.

Referring to the drawings, FIG. 1 is a process flow chart containing the basic steps necessary to practice our invention. The first step, preliminary to practicing our invention, is preparing the substrate 10, using materials 11 for the substrate and internal metallurgical structures. The second step is filling hole 12, using dry metallic particles 13. The third step is sintering 14. The fourth step is applying the external structures 15, using materials 16. The fifth step is filling 17, using molten metal, typically 90% lead, 10% tin solder 18. The step of preparing the substrate 10 is preliminary to practicing our invention, and the steps of applying external structures 15 and tinning 17 are process steps subsequent to practicing our invention, which may be employed to add additional structures, or solidify and strengthen the plug in the hole. Thus, our basic invention is included in the steps of filling the holes 12 with dry metallic particles 13 and sintering 14.

We shall now describe in greater detail the various steps of the process of FIG. 1, referring to FIGS. 2 through 6 for clarification as required.

(A) Preparing substrate 10

Preliminary to filling holes 12 and sintering 14, substrate 10 is prepared utilizing materials 11. The substrate materials are typically a "high-firing" ceramic, a "low-firing" ceramic, or other high temperature materials. A typical ceramic material of the "low-firing" type is described in copending application of McIntosh entitled "Ceramic Compositions and Fired Ceramic Bodies," Ser. No. 626,788, filed Mar. 29, 1967, and assigned to the same assignee as the present invention (IBM Docket No. 14,496). Typical of the high-firing ceramic substrate materials are alumina and forsterite, steatite, mullite, cordierite, porcelains, etc.

Figure 2:
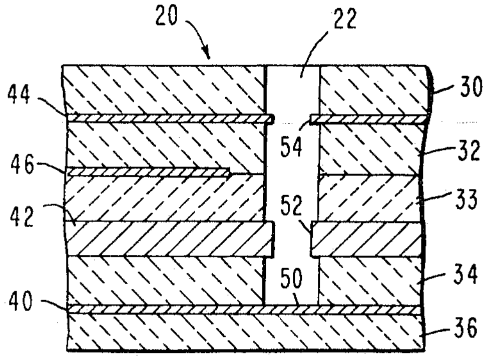
FIG. 2 is a section view through the center of a via hole in a multilayer circuit module, showing internal lands and other internal metallurgical structures.

Referring to FIG. 2, we show a laminated substrate 20 containing a plurality of ceramic slips 30, 32, 33, 34 and 36.

The step of preparing substrate 10 may also include the application of internal metallurgical or electrical structures. Referring again to FIG. 2, a variety of possible internal metallurgical structures is illustrated. For example, voltage or ground plane 40, heat sink 42, and circuit lines 44 and 46. Other electrical, thermal, or magnetic internal metallurgical structures are also possible, and are applied to the ceramic slips and bonded into the multilayer ceramic circuit module by methods well known in the art. Typical materials used in these internal metallurgical structures are silver, copper tungsten, palladium, and molybdenum magnesium alloys.

In order to practice our invention, it is required that during the step of preparing substrate 10, via holes and/or transverse holes be provided interconnecting the internal metallurgical structures. For the purpose of this invention, a via hole is a very small hole in a multilevel ceramic module. Said hole may have one or two external openings; when there is only one, it is a cavity or a closed bottom hole. A transverse hole is a hole which does not end at the surface of the substrate, such as those connecting via holes. For the purpose of this invention, a transverse hole must have at least one opening into a via hole. Referring once again to FIG. 2, via hole 22 is shown, interconnecting internal structures 40, 42 and 44, providing means for a butt connection at 50, and edge connections at 52 and 54. In multilevel ceramic circuitry art, the development of micro miniaturization in electrical components requires the use of an extremely small via hole. Via holes the size of 5 mils have been successfully filled using our invention, and via holes of the range of 5 to 100 mils in diameter and smaller are typical.

Figure 6:
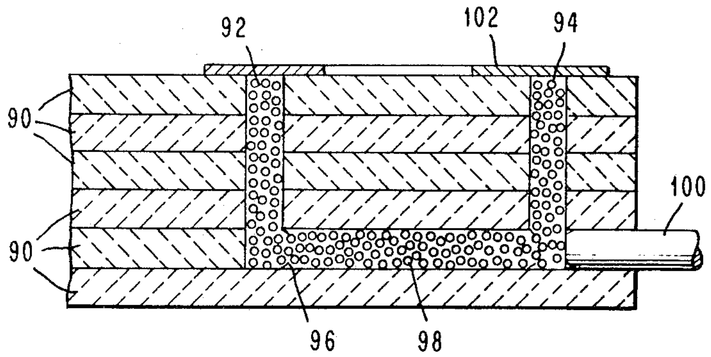
FIG. 6 is still another preferred embodiment of our invention, showing a multilayer circuit module having a transverse hole which is filled with metallic particles and sintered, and also showing connection to an external pin.

Also, during the process step of preparing substrate 10, transverse holes may be provided. Referring to FIG. 6, we illustrate transverse hole 96, interconnecting via holes 92 and 94. A transverse hole is a hole which is not normal to the surface of the substrate, and may be parallel to said surface, as shown in FIG. 6 at 96, or may be set at an angle with respect to said external surface, not shown. Transverse hole 96 may be provided by any method, and our invention will successfully provide a conductive path through a transverse hole which is as small as 15 mils in diameter. Typically, holes of the size from 15 mils to 100 mils diameter are desirable in the building of multilevel ceramic circuit modules.

In the step of preparing substrate 10, one of the major advantages of our operation becomes readily apparent: that is, a number of ceramic slips 30, 32, 33, 34 and 36 may be bonded together before filling the via holes in each individual slip, eliminating the exposure to failures in the conductive path between layers. Thus, a deep, narrow via hole 22 may be created through a plurality of ceramic slips bonded together in multilevel ceramic circuit module 20 before filling the hole. This was not practical in the prior art, which used powders in a binder or paste. It was necessary to assure a proper connection or bond in the plug between each level in the ceramic circuit module. Thus, the prior art required many times the number of bonds in a given ceramic module, with concomitant high exposure to failure in the conductive paths. Further, our invention will allow the use of closed end holes in the substrate, such as via hole 22 with the closed end at butt contact 50; however, open end bottoms are permissible, as shown later.

The step of preparing substrate 10 may include the step of firing the substrate before, during or after the internal structures. Usually, when using high-temperature ceramic, the substrate and internal structures are fired before filling hole 12. On the other hand, when low-temperature ceramic is used, it is typical to fire the substrate while sintering 14. Depending upon the materials used, an oxidizing or reducing atmosphere may be used for firing.

(B) Filling hole 12

A critical step in practicing our invention is filling holes 12 with dry metallic particles 13. Dry metallic powders are those without paste or binder; that is, free flowing. Our advance over the art is the elimination of this paste or binder the very use of which has been found difficult in filling closed bottom holes and which furthermore has restricted the depths of holes which could be filled with metallic particles. The metallic powder which may be used to practice our invention includes silver, silver copper eutectic, prealloyed 80 silver 20 palladium, alloys of noble metals, refractory metals, etc. The material selected for a particular embodiment should be selected so as to be metallurgically compatible with other materials used in the module. That is, the temperature hierarchy and sintering atmosphere of the process should be considered as well as the bonding characteristics of the metallic particles. The temperature hierarchy of the process may require, with certain exceptions, that each step in the process be conducted at a lower temperature. The bonding characteristics of adjacent materials require that a sufficient bonding take place to provide a thermal or electrical connection where required, yet not be so extensive as to amount to an alloying which causes an appreciable reduction in the volume of the material.

A critical consideration in practicing our invention, and necessary in order to achieve the uniform and reliable metallic connection which is the object of our invention, is the particle size of the metallic powder. We have found best results when the powder particle size is approximately .5 to 3 mils for 5 to 100 mil diameter via holes and smaller and 15 to 100 mils diameter transverse holes. The metallic particle size is selected to fall within this given range to assure that when the particles are sintered they fill as much of the hole as possible and thus provide the highest possible electrical conductivity and mechanical reliability. Where the particles are less than .5 mils, they can be non-free-flowing and may stick to each other due to their high surface energies if filler or other surface treatments are not used. Thereafter, when the very fine particles are sintered. their volume is reduced excessively. On the other hand, if the particles are too large, i.e., much greater than 3 mils in diameter, the fewer number of particle-to-particle contacts results in lower electrical conductivity and a less mechanically reliable conductor. Whatever portion of the preferred range the particles are in, for a hole of given diameter, the particle size should be chosen such that the diameter of the particles is less than ⅙ of the diameter of the hole. Intermixes or close fractions of these particle sizes are usable. A relatively small quantity of particles falling outside of this range, particularly on the low end, can be tolerated.

Figure 5:
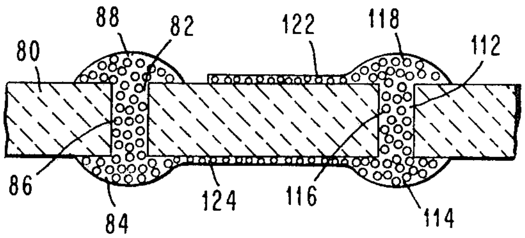
FIG. 5 is another preferred embodiment of our invention, showing a single layer ceramic substrate, having two via holes the top and bottom side electrically connected with sintered metallic particles.

Many techniques may be employed for the process step of filling holes 12 with dry metallic particles 13; such as, cascading, brushing, or pouring the powder into the hole, or vibrating the ceramic substrate or powder in a powder bath, and then wiping the surface to clean off excess powder. In filling open ended holes, the substrate may be laid upon a flat surface; or as shown in FIG. 5, a sintered metallic plug 84, 114 may be employed to cover the bottom of the hole 82, 112 before filling.

(C) Sintering 14

The process step of sintering 14 is performed by heating the dry metallic particles and substrate for a time and at a temperature sufficient to cause a bonding between the particles and to the internal structures and substrate. The temperature and time required for sintering are dependent upon the materials selected for the powder, the substrate, and the internal structures. As previously discussed, the temperature hierarchy of the process normally requires that sintering be conducted at a temperature lower than temperatures used for previous operations in preparation of the substrate although special cases can use the same temperature. Also, the temperature and time selected must be sufficient to cause a bonding between the dry metallic particles and the internal metallic structures, yet insufficient to cause an extensive alloying of the internal structures with the powder particles. Such an alloying would result in a decrease in volume, with subsequent failure at the connection. The process step of sintering 14 may be conducted in an oxidizing or a reducing atmosphere, as dictated by the materials selected.

(D) Applying external structures 15

Figure 3:
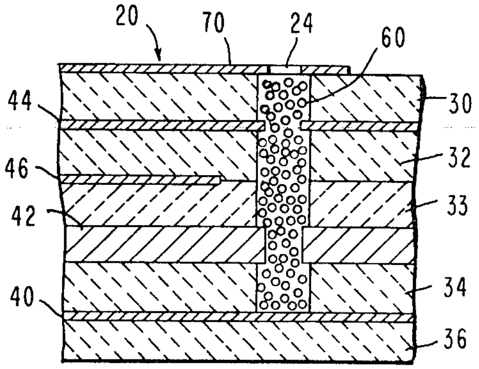
FIG. 3 is the same view as FIG. 2 of the circuit module, after the via hole has been filled with metallic particles, sintered, and external lands applied to the top circuit.

After the process step of filling holes 12 and sintering 14, if it is desired that connection be made to external structures, the next step in the process would be to apply the external structures 15. Illustrative of the types of external structures which may be used are external land 70 in FIG. 3, external land 102 in FIG. 6, and external lands 122, 124 of FIG. 5. Referring to FIG. 3, external land 70 is deposited as by silk screening and other methods onto the surface of the ceramic circuit module 20 by processes well known in the art, and includes an opening 24 over the surface of via hole 22. Referring to FIG. 6, external land 102 has been applied over the surface of via holes 92 and 94, but does not include an opening over said holes.

Referring to FIG. 5, means are described for interconnecting one side of the ceramic circuit module with the other. External circuitry 124, and plugs 84 and 114 are formed by screening of metallic paste, dried, and fired. The via holes 82 and 112 are next filled with metallic particles 86 and 116, and sintered. External circuitry or lands 122 and plugs 88, and 118 are screened on top of the ceramic circuit module, dried and fired. In this particular configuration, we have found it advisable to perform the operation described below; that is, tinning or soaking in molten metal.

Figure 7:
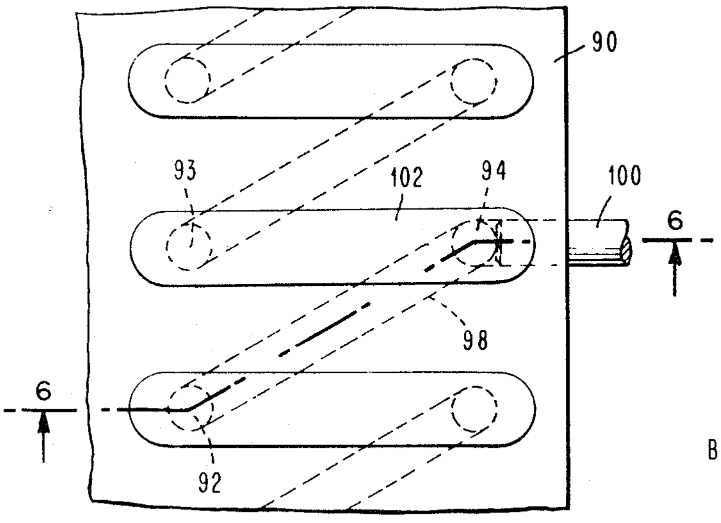
FIG. 7 is a top view of FIG. 6, showing the relationship between external lands and transverse holes for providing a series of coils for an inductor.

Referring to FIG. 7 in connection with FIG. 6, we described a number of inductor coils. A typical loop in the coil is formed by via hole 92, transverse hole 98, via hole 94, and external land 102. Said via holes 92 and 94, transverse hole 98, and external land 102 are formed as heretofore described. Of course, while not shown, it is obvious that the typical loop of the coil could be formed by via holes 92 and 94, with an external land connecting said via holes 92 and 94 and a transverse hole extending from via hole 94 to via hole 93.

Referring to FIG. 6 external pin or heat sink 100 represents another type of external metallurgical structure which may be connected to a via or transverse hole 94, 96 filled with sintered metallic particles 98.

While not shown, it is possible to apply the external srtuctures prior to filling the via hole and sintering, provided that when applying the external structures, an open ring is left on the top surface of the substrate about the via hole allowing subsequent filling of the via hole.

Typical of the types of materials used for these external metallic structures are silver, palladium, copper, prealloyed 80 silver 20 palladium, silver copper eutectic, noble metal alloys, and refractory metals and their alloys. The material is selected on the basis of the temperature hierarchy of the process, and compatibility of the materials with which it is to make contact.

(E) Soaking 17

Figure 4:
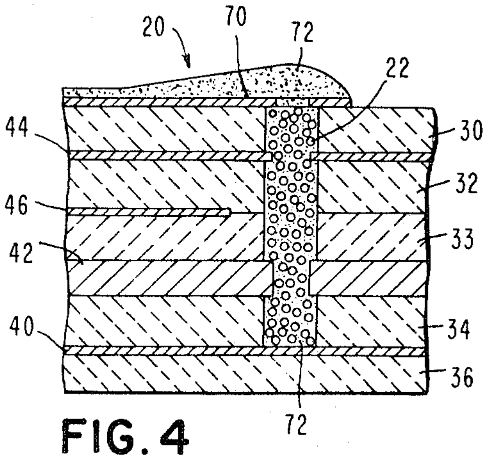
FIG. 4 is still another view of the multilayer ceramic circuit module, after solder has been applied to the surface of the via hole, and allowed to permeate down through the via hole to form a solid metallic plug.

The process step of soaking 17 with molten metal 18 may be performed in order to create a solid metallic plug in the via hole. Referring to FIG. 4, solder 72 has been applied to the surface of via hole 22 and alolwed to permeate down between the metallic particles 60 to form a solid metallic plug with edge contacts at 54 and 52, and a butt contact at 50. While this step is not essential to practice our invention, the resulting metallic plug does show improved characteristics of strength and conductivity. In FIG. 3, we have shown opening 24 in external land 70. This is not necessary, and depending upon the material of the external land 70, the solder may permeate through said land to fill the voids between sintered particles 60. One method for applying solder to the surface of via hole 22 has been to dip the entire substrate into a molten solder bath for a period of time sufficient to allow the solder 72 to permeate to the bottom of the via hole 22. Other methods known to the art such as preforms, wave soldering, etc. may be used. Another advantage in soaking the ceramic module in molten metal is that if there is any particles on the surface of the ceramic, they will be dissolved in the molten metal and leave a clean surface.

(F) Examples

Referring now to FIGS. 1 through 4, we shall describe a few of the many combinations of materials and formats which may be employed to practice our invention. The first such combination uses ceramic slips 30, 32, 33, 34 and 36 of high temperature alumina or porcelain which is fired in the range of 1300 to 1525 degrees centigrade to volatilize the binder. The internal lands 44, 46 and 40 and the internal metallurgical structure 42 are of palladium. The slips are bonded together such that the via hole 22 in each of the ceramic slips is aligned to form the via hole 22 in circuit module 20. Next, the ceramic slips and the palladium internal lands are fired at 1300 to 1525 degrees centigrade after volatilization of the organic constituents of the binder to mature the ceramic and sinter the internal palladium lands and thereby form a monolithic ceramic structure. This completes the process step of preparing substrate 10.

Next, the via holes 22 are filled with the metallic particles 60 of silver palladium powder (prealloyed 80 silver 20 palladium) by vibrating the ceramic module 20 in a bath of metallic powder. The powder is then sintered at a temperature of about 1000 degrees centigrade for about 10 minutes.

At this point in the process, a satisfactory conductive path has been provided by the sintered particles 50 between the internal metallurgical structures 40, 42 and 44. If desired, the process step of applying external structures 15 may be added. In this example, a silver palladium powder in a paste binder, for example, the type described in a copending application of Miller, entitled "Conductive Element and Method" Ser. No. 370,467, filed May 27, 1964 and assigned to the same assignee as the present invention, (IBM Docket No. 14,099), may be applied by methods well known in the art to form external land 70. This land is next fired at 750 degrees centigrade, a temperature sufficient to drive off the binder, but less than the melting point of the silver palladium powder in the via holes 22.

If a solid plug is desired in via hole 22, the next step in the process would be tinning 17 with solder 18, 72.

We next describe a second combination of materials, utilizing the low temperature ceramic described in copending application of McKintosh, entitled "Ceramic Compositions and Fired Ceramic Bodies" Ser. No. 626,788, filed Mar. 29, 1967 and assigned to the same assignee as the present invention (IBM Docket 14,496). In this combination, the internal metallurgical structures are of silver, the dry metallic powder is silver, and the external land is silver palladium. The ceramic substrate, the internal metallurgical structures and the dry metallic powders are heated according to the following firing cycle:

soak at 300° C. for 1.5 hours
increase from 300 to 600° C. during 3 hours
increase from 600 to 835° C. during 1½ hours
soak at 835° C. for 3 hours
decrease from 835 to 600° C. 1.5 hours
decrease from 600 to 300° C. during 3 hours
soak at 300° C. for 1.5 hours.

Next, the external land is applied, fired and tinned, if necessary.

A third combination of materials comprises internal lands of copper, dry metallic powder of silver copper eutectic, and external lands of copper.

While the invention has been particularly shown and described with reference to preferred embodiments, it will be understod by those skilled in the art that the foregoing and other changes in form and details may be made therein without departing from the spirit and scope of the invention.

What we claim as new and desire to secure by Letters Patent of the United States is:

1. Method for making contact between metallurgical structures of a substrate having via holes at least 5 mils in diameter, comprising the steps of:

preparing a substrate having internal metallurgical structure and via holes interconnecting said structure, filling said holes with dry metallic particles .5 to 3 mils in diameter, and sintering said particles at a temperature and for a time sufficient to form a bond between said metallic particles and said metallurgical structures, dipping said substrate in molten metal for a time sufficient to allow said metal to permeate between said sintered metal particles.

2. Method for making contact between internal metallurgical structures of a substrate and external metallic lands, said substrate having via holes at least 5 mils in diameter interconnecting said internal structures and external lands, comprising the steps of:

preparing a substrate having internal metallurgical structures and via holes, filling said holes with dry metallic particles .5 to 3 mils in diameter, sintering said particles at a temperature and for a time sufficient to form a bond between said internal metallic structures and said metallic particles, applying external lands over said via holes, and firing said external lands for a time and at a temperature sufficient to form a bond between said external lands and said metallic particles, whereby shrinkage of said contact is reduced to a minimum.

3. Method for making an inductor coil, the steps for making each loop of said coil comprising.

providing a multilayer ceramic substrate having a first pair of via holes, a second pair of via holes, and a transverse hole interconnecting each of said via holes in each of said pairs;

filling with dry metallic particles said first pair of via holes in a substrate, said transverse hole interconnecting said first pair of via holes, and said second pair of via holes, said metallic particles having diameters of .5 to 3 mils wherein all particle diameters are less than 1/6 said via and transverse hole diameters, sintering said particles, applying an external land interconnecting one of said first pair of via holes with one of said second pair of via holes, whereby shrinkage of said contact is reduced to a minimum.

References Cited

UNITED STATES PATENTS

| | | | |
|---|---|---|---|
| 2,862,992 | 12/1958 | Franz | 29—627UX |
| 2,981,868 | 4/1961 | Severson | 29—627UX |
| 3,233,310 | 2/1966 | Carl | 29—627UX |
| 3,311,966 | 4/1967 | Shaheen et al. | 29—530X |
| 3,312,771 | 4/1967 | Hessinger et al. | 29—628UX |
| 2,937,351 | 5/1960 | Craig | 29—625UX |

OTHER REFERENCES

Page 20, Metals Handbook, copy in Group 323, 5th edition.

JOHN F. CAMPBELL, Primary Examiner

R. W. CHURCH, Assistant Examiner

U.S. Cl. X.R.

29—625, 628, 530, 620, 420, 25.42, 471.9; 156—89; 75—208; 317—101, 261; 336—225, 205; 174—68.5